(12) United States Patent
Peruffo et al.

(10) Patent No.: US 6,456,953 B1
(45) Date of Patent: Sep. 24, 2002

(54) METHOD FOR CORRECTING MISALIGNMENT BETWEEN A RETICLE AND A STAGE IN A STEP-AND-REPEAT EXPOSURE SYSTEM

(75) Inventors: Neil J. Peruffo, Poughkeepsie, NY (US); Marc Postiglione, New Milford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/571,463

(22) Filed: May 16, 2000

(51) Int. Cl.[7] .......................... G06F 19/00; G03B 27/42
(52) U.S. Cl. ..................... 702/94; 702/95; 355/53
(58) Field of Search ................ 702/33, 34, 35, 702/36, 155, 94, 150; 700/123, 124, 125, 46, 31, 121; 356/399

(56) References Cited

U.S. PATENT DOCUMENTS

| | | | |
|---|---|---|---|
| 4,068,947 A | 1/1978 | Buckley et al. | 355/72 |
| RE30,601 E | 5/1981 | Horr et al. | 355/76 |
| 5,602,619 A | 2/1997 | Sogard | 355/53 |
| 6,040,096 A | * 3/2000 | Kakizaki et al. | 430/5 |

OTHER PUBLICATIONS

Buckley, Jere D, and Karatzas, Charles, "Step and scan: A systems overview of a new lithography tool", appearing in SPIE vol. 1088 Optical/Laser Microlithography II pp. 424–433, 1089.*

* cited by examiner

*Primary Examiner*—Marc S. Hoff
*Assistant Examiner*—T. Stampf

(57) ABSTRACT

A method for correcting misalignment between a reticle and a stage in a MICRASCAN step-and-repeat exposure system. In such a system, the reticle and the stage lie in parallel X-Y planes and there are at least two temperature sensors associated with the reticle, sensor 1 and sensor 2, sensor 1 having a sensor 1 temperature output and sensor 2 having a sensor 2 temperature output. The method comprises the steps of estimating an X shift and a Y shift of the reticle relative to the stage using the sensor 1 temperature output and sensor 2 temperature output and correcting misalignment between the reticle and the stage using the estimated X and Y shifts.

4 Claims, 1 Drawing Sheet

METHOD FOR CORRECTING MISALIGNMENT BETWEEN A RETICLE AND A STAGE IN A STEP-AND-REPEAT EXPOSURE SYSTEM

TECHNICAL FIELD

The present invention relates generally to photolithography as applied to microcircuit fabrication and, more specifically, to a method for correcting misalignment between a reticle and a stage in a MICRASCAN step-and-repeat exposure system.

BACKGROUND OF THE INVENTION

The fabrication of integrated circuits requires a number of photolithographic fabrication steps to form the intricate circuitry that is required for a particular chip design. The process comprises sequentially creating multiple layers on the chip, each with intricate circuit patterns. A number of methods are known for creating the various patterned layers, including a widely used process known as photolithography. According to this process, a photoresist layer is first applied over the surface on which it is desired to form a pattern. An image of a desired circuit pattern is next projected onto the photoresist layer. Typically, the photoresist layer hardens where exposed and becomes resistant to certain resist-removing techniques. The unexposed resist is next removed, and the underlying material is then uncovered and subsequently etched away. The expose resist is then removed and the underlying pattern uncovered for use.

Typically, more than one layer of circuitry is required in the manufacture of integrated circuits. Thus, the above process may be repeated more than once, creating multiple circuit layers separated by insulating layers and interconnected through vias, as needed. All of these layers must be accurately aligned, one on top of another.

The pattern projected onto the photoresist for each layer is carried onto a reticle, each reticle carrying the pattern for one layer. The reticle usually comprises a finely etched pattern of metal (such as chrome) on a glass or quartz substrate.

In a commercial manufacturing process, more than one chip is produced simultaneously on a single object, such as a silicon wafer. Typically a pattern is exposed onto each chip through a step-and-repeat process in which the wafer or the reticle is moved between exposures to bring a new chip in place for exposure. This process requires precise alignment between the reticle and the target area of the object.

An early approach to solving the alignment problem was contact alignment in which the reticle was placed in actual contact with the object and the light source was a collimated ultra violet (UV) source illuminating the entire image on the reticle. With the need for finer and finer patterns, however, it soon became essential to remove the reticle from contact with the object surface so that the image of the reticle could be reduced by projection onto the photoresist layer.

U.S. Pat. No. 4,068,947 issued to Buckley, et al. describes a system for a projection-type exposure and aligning system originally developed and marketed by the Perkin-Elmer Corporation under the trademark MICRALIGN. In the MICRALIGN system, a wafer, on which a plurality of chips will be manufactured, and the reticle, with the appropriate pattern, are mounted on a carriage. A light source illuminates a selected area of the reticle and focuses a portion of the image onto the photoresist. The carriage is moved so that the illuminated region is scanned across the reticle and the wafer. Unfortunately, the MICRALIGN system used a 1:1 projection ratio and did not provide for image reduction.

A different approach, known as step-and-repeat, uses a stepper to sequentially project a full image of the reticle onto each chip on the wafer. Although this method is simple, provides good alignment, and uses reducing optics, the demands for a full-field optical system become more stringent as feature sizes shrink and chip sizes increase.

The next step was the development of equipment such as the MICRASCAN system marketed by SVG Lithography Systems Inc. (hereinafter "SVG"). SVG is a subsidiary of Silicon Valley Group Inc. which, in turn, is a successor to the lithography business of Perkin-Elmer. In the MICRASCAN system, each chip is exposed by scanning onto the wafer a demagnified image of a slit moving over the reticle, from chip-to-chip on the wafer. This system is similar in concept to the MICRALIGN system, but substantially more complex as it requires synchronous scanning of the wafer and reticle relative to the optical system, with the wafer moving slower than the reticle to obtain image reduction. This advantage is achieved in the MICRASCAN system using two interferometrically controlled air bearing stages driven by linear motors.

Although the MICRASCAN system has proven extremely useful in the commercial fabrication of integrated circuits, it suffers from a need for frequent alignment calibration between the reticle and the stage on which the wafer is mounted to correct for drift due to temperature change, a procedure referred to as "reticle refresh." Deciding when to perform reticle refresh is important as the procedure interrupts the normal production progress, resulting in lost time. Drift appears to be large during the early operation of the equipment and as time passes it becomes negligent. It is thus important to know when to implement reticle refresh.

SVG has partially addressed the drift-refresh problem by monitoring the reticle stage front plate temperature. A good correlation has been found between the drift in shift X of the reticle and the temperature change of one of two temperature sensors provided by SVG on the MICRASCAN system. Software is used to read the temperature at each wafer alignment and apply it to either a default calibration coefficient or to an externally set coefficient. The resulting values are applied to the reticle refresh shift X and shift Y solution for a current wafer, and the sum total compensation since the last reticle refresh is compared to a maximum correction limit. If this limit is exceeded, a command is issued to perform a reticle refresh cycle.

Experience has shown that, during typical production of integrated circuits, reticle refresh will occur every three to four wafers or, in terms of time, every four to five minutes. Reticle refresh takes about a minute to perform, which results in loss of production time and may also result in progressively larger alignment errors in the wafers between refresh cycles.

There is a need, therefore, for a system that can be implemented on the MICRASCAN system that will reduce the need for reticle refresh. There is also a need for a system that can be implemented on the MICRASCAN system that further reduces alignment errors and improves productivity.

SUMMARY OF THE INVENTION

To meet these and other needs, and in view of its purposes, the present invention provides a method for correcting misalignment between a reticle and a stage in a MICRASCAN step-and-repeat exposure system. In such a system, the reticle and the stage lie in parallel X-Y planes and there are at least two temperature sensors associated with the reticle, sensor 1 and sensor 2, sensor 1 having a sensor 1 temperature output and sensor 2 having a sensor 2 temperature output. The method comprises the steps of:

(a) correlating reticle X shift as a function of the sensor 1 temperature output;

(b) correlating reticle Y shift as a function of the sum of the sensor 1 and sensor 2 temperature outputs;

(c) calculating a coefficient 1 equal to the slope of the correlation obtained in step (a);

(d) calculating a coefficient 2 equal to the slope of the correlation obtained in step (b);

(e) loading a first object on the stage;

(f) aligning the reticle relative to the stage and determining a first X shift ($X_1$ shift) of the reticle relative to the stage and a first Y shift ($Y_1$ shift) of the reticle to the stage;

(g) aligning the first object relative to the stage;

(h) obtaining a first sensor 1 temperature output ($T_1S_1$) and a first sensor 2 temperature output ($T_1S_2$);

(i) exposing the first object to radiation through the reticle;

(j) unloading the first object;

(k) loading a second object on the stage;

(l) obtaining a second sensor 1 temperature output ($T_2S_1$) and a second sensor 2 temperature output ($T_2S_2$);

(m) estimating a second X shift ($X_2$ shift) and a second Y shift ($Y_2$ shift) of the reticle relative to the stage using the relationships:

$$X_2 \text{ shift} = (T_2S_1 - T_1S_1) * \text{coefficient 1};$$

$$Y_2 \text{ shift} = [(T_2S_1 - T_1S_1) + (T_2S_2 - T_1S_2)] * \text{coefficient 2};$$

(n) estimating a total X shift ($X_{total}$ shift) and a total Y shift ($Y_{total}$ shift) using the relationships:

$$X_{total} \text{ shift} = X_1 \text{ shift} + X_2 \text{ shift};$$

$$Y_{total} \text{ shift} = Y_1 \text{ shift} + Y_2 \text{ shift};$$

and (o) correcting misalignment between the reticle and the stage using the $X_{total}$ shift and the $Y_{total}$ shift.

The invention also provides a method for correcting reticle X shift and reticle Y shift between a reticle and a stage in a MICRASCAN step-and-repeat exposure system. In such a system, there are at least two temperature sensors associated with the reticle, sensor 1 and sensor 2, sensor 1 having a sensor 1 temperature output and sensor 2 having a sensor 2 temperature output. The method comprises the steps of:

(a) estimating an X shift ($X_{total}$ shift) by multiplying a coefficient 1 representing a reticle X shift per degree of temperature output of sensor 1 with a difference of the temperature output of sensor 1 between a first and a second time;

(b) estimating a Y shift ($Y_{total}$ shift) by multiplying a coefficient 2 representing a reticle Y shift per degree of the sum of temperature outputs of sensors 1 and 2 with the difference between the sum of the temperature outputs of sensor 1 and sensor 2 between the first and the second time; and (c) correcting reticle X shift and reticle Y shift between the reticle and the stage using the calculated X shift ($X_{total}$ shift) and Y shift ($Y_{total}$ shift).

Typically, the object is a wafer of the type used in the production of integrated circuits, such as a silicon wafer. The object usually comprises a plurality of adjacent distinct exposure fields that are exposed to radiation sequentially through the reticle.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DESCRIPTION OF THE INVENTION

Figure 1:
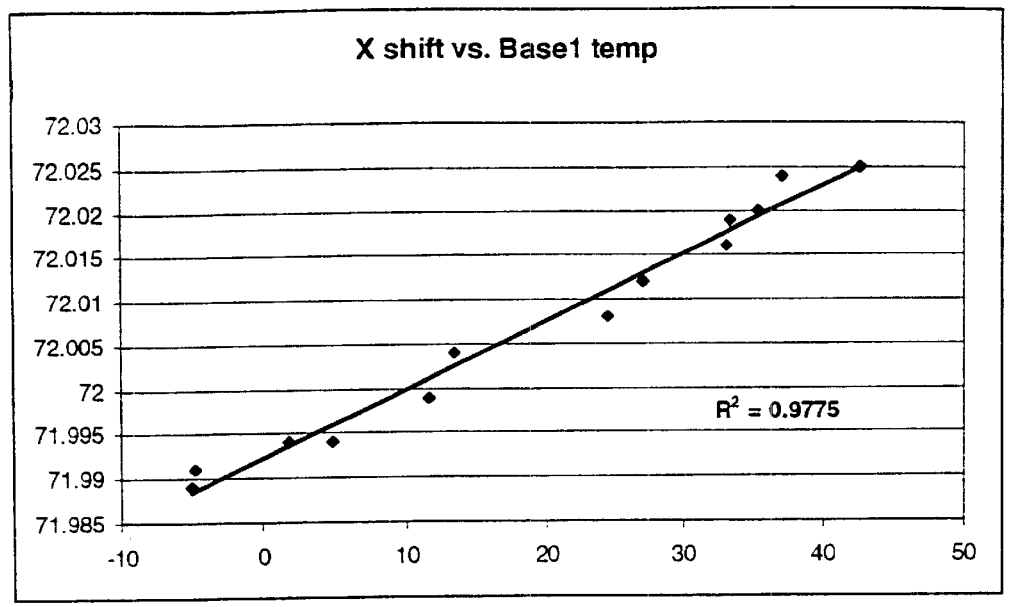
FIG. 1 illustrates X shift as a function of the temperature output of sensor 1.

The invention will next be described with reference to the specific exposure system to which it pertains. This system is well known in the art as the MICRASCAN system, and is manufactured by a division of the Silicon Valley Group as mentioned earlier. This system permits step-and-repeat exposure of multiple chips on a silicon wafer of the type used in the fabrication of integrated circuits.

The MICRASCAN system permits adjustment of the reticle and the stage in an X-Y plane and is equipped with at least two temperature sensors that provide reticle temperature information. The actual equipment is exceedingly complex and includes a number of stepping motors, transducers, optics, and other components that are essential for the operation of the device. They are not essential, however, to understand the present invention.

The portion of the MICRASCAN system relevant to the present invention includes a stage which may be moved along an X axis and a Y axis. Over the stage there is a reticle support stage. Mounted on the reticle support stage is a reticle containing the pattern to be exposed onto the object which is loaded on the stage. The reticle support stage may also be moved along the X and Y axes independently of the stage. The reticle is supported in a plane parallel to the plane of the stage.

A light source, typically a UV laser light source, is provided to illuminate a portion of the reticle and to project an image pattern onto an object placed on the stage. Optics not shown are also provided so that the image projected is demagnified, preferably by a ratio of 4:1. Such demagnification is not essential, however, to understand or practice the invention and the same principle may be applied for images projected at other ratios, including a 1:1 ratio.

As identified by the manufacturer, the reticle of the MICRASCAN system has two temperature sensors associated with it, sensor 1 and sensor 2. The outputs of sensors 1 and 2 are sent to a controller, such as a computer.

Alignment between the reticle and an object loaded on the stage involves three steps. First, the reticle is aligned with respect to the stage using a calibration field provided on the stage. Next, the stage is aligned relative to a fixed reference. Third, an object is loaded on the stage and aligned relative to the fixed reference. A detailed description of aligning the reticle relative to the object is provided by the manufacturer of the MICRASCAN system.

During operation of the MICRASCAN system, a reticle refresh cycle, as discussed earlier, is often needed to assure continued alignment between the reticle and the object. It has been discovered that the frequency of the reticle refresh cycle can be reduced by using the temperature output of sensors 1 and 2 to estimate X and Y shift of the reticle relative to the stage, and using the software provided by the manufacturer to control reticle alignment. By monitoring the temperature outputs of sensors 1 and 2, correction coefficients can be derived which are used with the temperature outputs of sensors 1 and 2 to estimate X shift and Y shift of the reticle relative to the stage.

FIG. 1 shows a correlation by linear regression of reticle X shift (in nanometers) as a function of the sensor 1 temperature output (in degrees centigrade). The slope of the correlation illustrated in FIG. 1 is:

$$R^2=0.9775.$$

The slope of reticle X shift as a function of sensor 1 temperature output, coefficient 1, can be used to predict reticle misalignment about the X axis.

Figure 2:
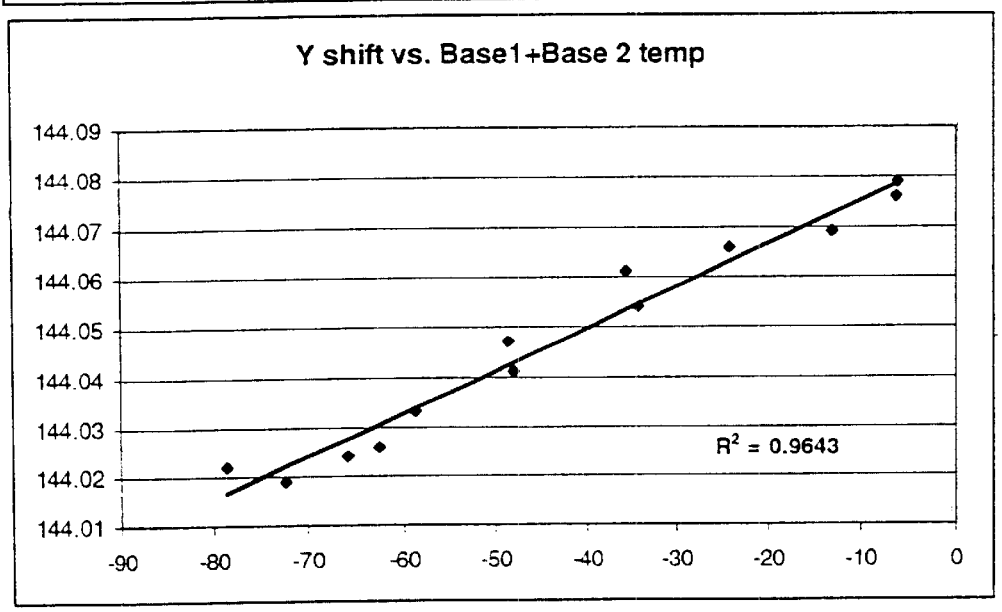
FIG. 2 illustrates Y shift as a function of the sum of the temperature outputs of sensors 1 and 2.

FIG. 2 shows a correlation by linear regression of reticle Y shift (in nanometers) as a function of the sum of the sensor 1 and sensor 2 temperature outputs (in degrees centigrade). The slope of the correlation illustrated in FIG. 2 is:

$$R^2=0.9643.$$

It has been discovered that the slope of reticle Y shift as a function of the sensor 1 and sensor 2 temperature outputs, coefficient 2, can be used to predict reticle misalignment about the Y axis.

In practice, having determined coefficient 1 and coefficient 2 for a MICRASCAN system by constructing the curves of FIG. 1 and FIG. 2, either from past data or by actually measuring X and Y shift during reticle X and Y shift corrections applied for a number of temperature outputs for sensors 1 and 2, the reticle refresh cycle may be eliminated after performing a reticle refresh on the first object.

First the system is calibrated as required by the manufacturer for a first object, i.e., a first object is mounted and aligned on the stage. The temperature outputs of sensor 1 ($T_1S_1$) and sensor 2 ($T_1S_2$) are then obtained. Typically, the first object will next undergo exposure and will be replaced by a second object which is again mounted and aligned on the stage. The temperature output of the sensors 1 and 2, $T_2S_1$ and $T_2S_2$, are again obtained and the $X_2$ and $Y_2$ shifts are calculated as follows:

$$X_2 \text{ shift}=(T_2S_1-T_1S_1)*\text{coefficient 1}; \quad (1)$$

and $$Y_2 \text{ shift}=[(T_2S_1-T_1S_1)+(T_2S_2-T_1S_2)]*\text{coefficient 2}.$$

The $X_2$ and $Y_2$ shifts are then used to correct misalignment between the reticle and the stage without need for a reticle refresh cycle.

In practice the object is typically a silicon wafer on which a plurality of chips are manufactured. Following the initial alignment of the reticle, each chip is typically exposed to the same reticle pattern and a number of wafers are sequentially mounted on the stage, aligned on the stage, and exposed. Preferably, the reticle X and Y shift correction described above is applied every time a wafer is removed from the stage following exposure of all chips and a new wafer is mounted on the stage. It is within the scope of this invention, however, to apply the reticle correction every time the wafer is stepped to expose a new chip.

In accordance with the present invention, misalignment between a reticle and a stage in a MICRASCAN step-and-repeat exposure system was corrected by the following steps. First, the reticle X shift was correlated as a function of the sensor 1 temperature output and the reticle Y shift was correlated as a function of the sensor 1 and sensor 2 temperature outputs. Next, two coefficients, coefficients 1 and 2, were calculated. Coefficient 1 was calculated as the slope of the correlation between reticle X shift and the sensor 1 temperature output. Coefficicent 2 was calculated as the slope of the correlation between reticle Y shift and the sum of the sensor 1 and sensor 2 temperature outputs. Following calculation of coefficients 1 and 2, a first object was loaded onto the stage. The reticle was then aligned relative to the stage by performing a reticle refresh. The reticle refresh also generated a first X shift ($X_1$ shift) of the reticle relative to the stage and a first Y shift ($Y_1$ shift) of the reticle to the stage. Next, the first object was aligned relative to the stage. A first sensor 1 temperature output ($T_1S_1$) and a first sensor 2 temperature output ($T_1S_2$) were then measured. Next, the first object was exposed to radiation through the reticle.

Following exposure of the first object, the first object was unloaded and a second object was loaded on the stage. Next, a second sensor 1 temperature output ($T_2S_1$) and a second sensor 2 temperature output ($T_2S_2$) were obtained. The second X shift ($X_2$ shift) and second Y shift ($Y_2$ shift) of the reticle relative to the stage were then estimated using the relationships:

$$X_2 \text{ shift}=(T_2S_1-T_1S_1)*\text{coefficient 1};$$

and $$Y_2 \text{ shift}=[(T_2S_1-T_1S_1)+(T_2S_2-T_1S_2)]*\text{coefficicent 2}.$$

Next, the total X shift ($X_{total}$ shift) and total Y shift ($Y_{total}$ shift) were estimated using the relationships:

$$X_{total} \text{ shift}=X_1 \text{ shift}+X_2 \text{ shift};$$

and $$Y_{total} \text{ shift}=Y_1 \text{ shift}+Y_2 \text{ shift}.$$

The total X shift ($X_{total}$ shift) and total Y shift ($Y_{total}$ shift) were then used to correct misalignment between the reticle and the stage.

Following correction of misalignment between the reticle and the stage, the second object was aligned relative to the stage. The second object was then exposed to radiation through the reticle and unloaded. A third object was then loaded on the stage and a third sensor 1 temperature output ($T_3S_1$) and a third sensor 2 temperature output ($T_3S_2$) were obtained. Next, a third X shift ($X_3$ shift) and a third Y shift ($Y_3$ shift) of the reticle relative to the stage were estimated using the relationships:

$$X_3 \text{ shift}=(T_3S_1-T_2S_1)*\text{coefficient 1};$$

and $$Y_3 \text{ shift}=[(T_3S_1-T_2S_1)+(T_3S_2-T_2S_2)]*\text{coefficicent 2}.$$

Following estimation of the third X shift ($X_3$ shift) and third Y shift ($Y_3$ shift), a total X shift ($X_{total}$ shift) and a total Y shift ($Y_{total}$ shift) were estimated using the relationships:

$$X_{total} \text{ shift}=X_1 \text{ shift}+X_2 \text{ shift}+X_3 \text{ shift};$$

and $$Y_{total}\text{ shift} = Y_1\text{ shift} + Y_2\text{ shift} + Y_3\text{ shift}.$$

Next, misalignment between the reticle and the stage was corrected using the $X_{total}$ shift and the $Y_{total}$ shift.

Following correction of misalignment between the reticle and the stage, the third object was aligned relative to the stage. The third object was then exposed to radiation through the reticle and unloaded.

The above steps corresponding to the third object can then be repeated with subsequent wafers, as needed. For example, the X and Y shifts of wafer 15 would be estimated using the relationships:

$$X_{15}\text{ shift} = (T_{15}S_1 - T_{14}S_1)*\text{coefficient 1};$$

and $$Y_{15}\text{ shift} = [(T_{15}S_1 - T_{14}S_1) + (T_{15}S_2 - T_{14}S_2)]*\text{coefficicent 2}.$$

The total X shift ($X_{total}$ shift) and total Y shift ($Y_{total}$ shift) of wafer 15 would be estimated using the relationships:

$$\begin{aligned}X_{total}\text{ shift} = &X_1\text{ shift} + X_2\text{ shift} + X_3\text{ shift} + X_4\text{ shift} + X_5\text{ shift} + X_6\text{ shift} +\\& X_7\text{ shift} + X_8\text{ shift} + X_9\text{ shift} + X_{10}\text{ shift} + X_{11}\text{ shift} + X_{12}\text{ shift} + X_{13}\\&\text{shift} + X_{14}\text{ shift} + X_{15}\text{ shift};\end{aligned}$$

and $$\begin{aligned}Y_{total}\text{ shift} = &Y_1\text{ shift} + Y_2\text{ shift} + Y_3\text{ shift} + Y_4\text{ shift} + Y_5\text{ shift} + Y_6\text{ shift} + Y_7\\&\text{shift} + Y_8\text{ shift} + Y_9\text{ shift} + Y_{10}\text{ shift} + Y_{11}\text{ shift} + Y_{12}\text{ shift} + Y_{13}\text{ shift}\\&+ Y_{14}\text{ shift} + Y_{15}\text{ shift}.\end{aligned}$$

Generally, a batch of about 25 wafers are scanned and exposed.

Those having the benefit of the above description of the invention will realize that there are mechanisms by which to obtain the needed data to construct FIGS. 1 and 2, and derive from that data coefficients 1 and 2. Furthermore, coefficients 1 and 2 may also be derived through trial and error as well as theoretical calculations of the effect of temperature change on the X and Y shift. Such modifications to the invention are within the scope of the invention.

Although illustrated and described above with reference to specific embodiments, the invention is nevertheless not intended to be limited to the details shown. Rather, various modifications may be made in the details within the scope and range of equivalents of the claims and without departing from the spirit of the invention.

What is claimed is:

1. A method for correcting reticle X shift and reticle Y shift between a reticle and a stage in a step-and-repeat exposure system, wherein there are at least two temperature sensors associated with the reticle, sensor 1 and sensor 2, sensor 1 having a sensor 1 temperature output and sensor 2 having a sensor 2 temperature output, the method comprising the steps of:

(a) estimating an X shift ($X_{total}$ shift) by multiplying a coefficient 1 representing a reticle X shift per degree of temperature output of sensor 1 with a difference of the temperature output of sensor 1 between a first and a second time;

(b) estimating a Y shift ($Y_{total}$ shift) by multiplying a coefficicent 2 representing a reticle Y shift per degree of the sum of temperature outputs of sensors 1 and 2 with the difference between the sum of the temperature outputs of sensor 1 and sensor 2 between said first and said second time; and (c) correcting reticle X shift and reticle Y shift between said reticle and said stage using said X shift ($X_{total}$ shift) and Y shift ($Y_{total}$ shift).

2. The method of claim 1 further comprising:

determining coefficient 1 prior to performing step (a), the determining of coefficient 1 comprising the steps of:

(d) correlating reticle X shift as a function of the sensor 1 temperature output; and (e) calculating a coefficient 1 equal to the slope of the correlation obtained in step (d).

3. The method of claim 2 further comprising:

determining coefficicent 2 prior to performing step (b), the determining of coefficicent 2 comprising the steps of:

(f) correlating reticle Y shift as a function of the sum of the sensor 1 and sensor 2 temperature outputs; and (g) calculating a coefficicent 2 equal to the slope of the correlation obtained in (f).

4. The method of claim 1 further comprising:

determining coefficicent 2 prior to performing step (b), the determining of coefficicent 2 comprising the steps of:

(f) correlating reticle Y shift as a function of the sum of the sensor 1 and sensor 2 temperature outputs; and (g) calculating a coefficicent 2 equal to the slope of the correlation obtained in (f).

* * * * *